(12) United States Patent
Durif et al.

(10) Patent No.: US 6,381,116 B1
(45) Date of Patent: Apr. 30, 2002

(54) CONTROL DEVICE OF AN ELECTROMAGNET WITH LOCAL CONTROL INPUT

(75) Inventors: Ghislain Durif, Meylan; Mustapha Chelloug, Echirolles, both of (FR)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 09/447,735

(22) Filed: Nov. 23, 1999

(30) Foreign Application Priority Data

Dec. 7, 1998 (FR) ............................................. 98 15555

(51) Int. Cl.[7] ............................................. H01H 47/00
(52) U.S. Cl. ............................................. 361/152
(58) Field of Search ............................... 361/152, 143, 361/94, 155, 191; 307/134

(56) References Cited

U.S. PATENT DOCUMENTS

| | | | | | |
|---|---|---|---|---|---|
| 4,720,761 A | * | 1/1988 | Saletta et al. | ............ | 361/152 |
| 5,394,018 A | * | 2/1995 | Elms | ............ | 307/134 |
| 5,402,302 A | * | 3/1995 | Boucheron | ............ | 361/160 |
| 5,406,440 A | * | 4/1995 | Wieloch | ............ | 361/154 |
| 5,781,396 A | * | 7/1998 | Fritschi et al. | ............ | 361/143 |
| 5,825,602 A | * | 10/1998 | Tosaka et al. | ............ | 361/94 |
| 5,901,025 A | * | 5/1999 | Takahashi et al. | ............ | 361/93 |
| 5,914,850 A | * | 6/1999 | Johansson | ............ | 361/187 |
| 5,959,826 A | * | 9/1999 | Baurand et al. | ............ | 361/156 |

FOREIGN PATENT DOCUMENTS

DE           94 03 299 U1      8/1995

* cited by examiner

*Primary Examiner*—Ronald W. Leja
(74) *Attorney, Agent, or Firm*—Roger W. Parkhurst; Larry I. Golden

(57) ABSTRACT

The control device comprises two power supply terminals and a local control terminal connected by a local control means to one of the power supply terminals. A control circuit receives on a first input a first full-wave rectified voltage representative of the supply voltage, and on a second input a second half-wave rectified voltage representative of the voltage applied to the local control terminal. To eliminate spurious orders, it compares a quantity G1 representative of at least one non-null sample of the second voltage to a percentage of a quantity G2 representative of associated samples of the first voltage, sampling of the two voltages being almost simultaneous. If $G1 \geq 0.8 G2$, the device considers that a control order has been received and if $G1 \leq 0.7 G2$, that no order has been received.

9 Claims, 4 Drawing Sheets

CONTROL DEVICE OF AN ELECTROMAGNET WITH LOCAL CONTROL INPUT

BACKGROUND OF THE INVENTION

The invention relates to a control device of an electromagnet comprising two power supply terminals, full-wave rectifying means connected to the power supply inputs, at least one coil connected in series with an electronic switch to the output of the rectifying means, means for controlling the electronic switch and a local control terminal designed to be connected to one of the power supply terminals by local control means able to take two states, respectively open and closed.

Conventionally the local control of an electromagnet, whether it involves a contactor or a coil of an electrical auxiliary (closing electromagnet XF or shunt release MX) of a circuit breaker, is formed by means of the pushbutton type. A programmable controller output is also sometimes used. In the latter case especially the presence of leakage currents may lead to spurious actuation of the electromagnet.

U.S. Pat. No. 5,394,018 describes a microprocessor-based contactor comprising means for distinguishing real AC control signals and stray input signals due to the presence of capacitors connected in parallel on the local control means. For this it comprises, between the local control means and the input, means enabling the offset existing between a stray input signal and a real input signal to be increased. Reading of the input signal is performed during this offset period. Such a system is complex and requires more components than an analog input (single dividing bridge).

SUMMARY OF THE INVENTION

The object of the invention is to achieve a device enabling this distinction to be made between real control signals and stray signals without presenting the shortcomings of the known contactor. This device must in addition operate in DC and at 400 Hz.

According to the invention this object is achieved by the fact that the device comprises a first resistive dividing bridge, connected to the output of the rectifying means and comprising a mid-point connected to a first input of the control means of the electronic switch, and a second resistive dividing bridge, connected between the local control terminal and an output terminal of the rectifying means and comprising a mid-point connected to a second input of the control means of the electronic switch, the control means comprising:

quasi-simultaneous sampling means for supplying associated samples of the first and second voltages applied respectively to the first and second inputs of the control means, comparison means for comparison of a first quantity, representative of at least one non-null sample of the second voltage, and of a preset percentage of a second quantity, representative of associated samples of the first voltage, and detection means for detecting the state of the local control means, the local control means being considered as being closed when the first quantity is greater than said percentage.

According to a development of the invention, the comparison means comprise means for comparing the first quantity to first and second percentages of the second quantity, the local control means being considered as being closed by the detection means when the first quantity is greater than or equal to the first percentage and as being open if it is lower than or equal to the second percentage, the second percentage being lower than the first percentage.

In a preferred embodiment, the local control means are considered by the detection means as not having changed state if the first quantity is comprised between the first and second percentages.

The first and second quantities are preferably formed respectively by the sum of a preset number of successive non-null samples of the second voltage and by the sum of the same number of associated samples of the first voltage.

The number of samples used for computation of the first and second quantity is preferably equal to or greater than 3, and for example 8. A decision concerning the state of the local control means is preferably taken after a preset number of successive comparisons leading to the same result.

BRIEF DESCRIPTION OF THE DRAWINGS

Other advantages and features will become more clearly apparent from the following description of particular embodiments given as non-restrictive examples only and represented in the accompanying drawings in which.

DETAILED DESCRIPTION OF THE PREFERRED EMBODIMENT

Figure 1:
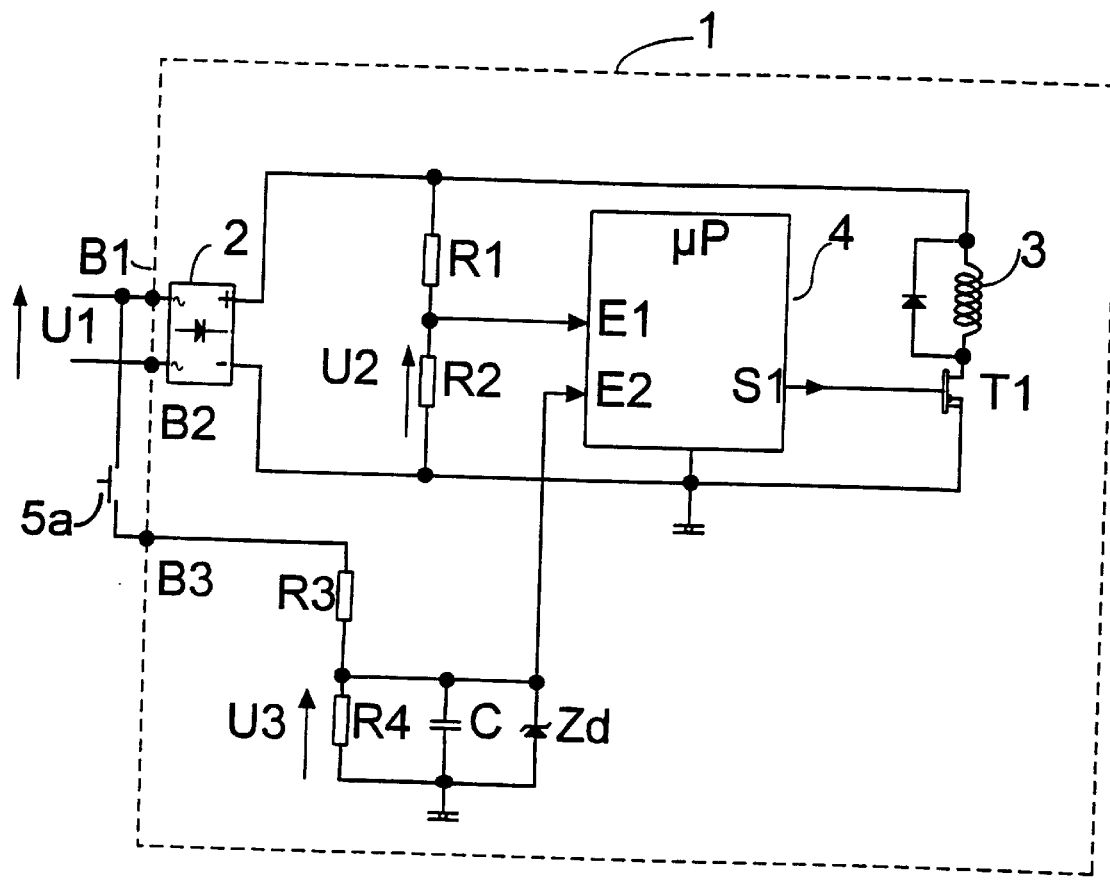
FIG. 1 illustrates a device according to the invention.

In FIG. 1, the control device 1 comprises two power supply terminals B1 and B2 connected to a full-wave rectifier 2, for example formed by a diode bridge. The DC output terminals of the rectifier supply a coil 3 connected in series with an electronic switch formed by a MOS-type transistor T1. A microprocessor-based control circuit 4 controls the electronic switch, one of its outputs S1 being connected to the control electrode of the transistor T1. A first input E1 of the control circuit 4 is connected to the mid-point of a first resistive dividing bridge, formed by two resistors R1 and R2 connected in series between the output terminals of the rectifier 2.

The device 1 comprises a local control terminal B3 designed to be connected to one of the power supply terminals B1 in FIG. 1 by a local control means formed by a pushbutton 5a in FIG. 1.

A second resistive dividing bridge is formed by two resistors R3 and R4 connected in series between the local control terminal B3 and one of the output terminals of the rectifier. According to a preferred embodiment, the second resistive dividing bridge is connected between the terminal B3 and the ground. A capacitor C and a protective Zener diode ZD are connected in parallel to the resistor R4. The mid-point of the second resistive dividing bridge is connected to a second input E2 of the control circuit 4.

Figure 2:
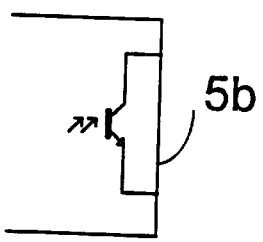
FIG. 2 represents a programmable controller output able to be used instead of the pushbutton of FIG. 1.

The pushbutton 5a of FIG. 1 can be replaced by a programmable controller output 5b, only those elements of which indispensable for understanding are represented in schematic form in FIG. 2. The output 5b is formed by the output stage of an opto-electronic coupler, which is turned on when it has to transmit a local control signal to the device 1. The programmable controller output can also be constituted by a relay contact.

The control device operates in the manner described below with reference to FIGS. 3a to 3d, 4 and 5.

Figure 3:
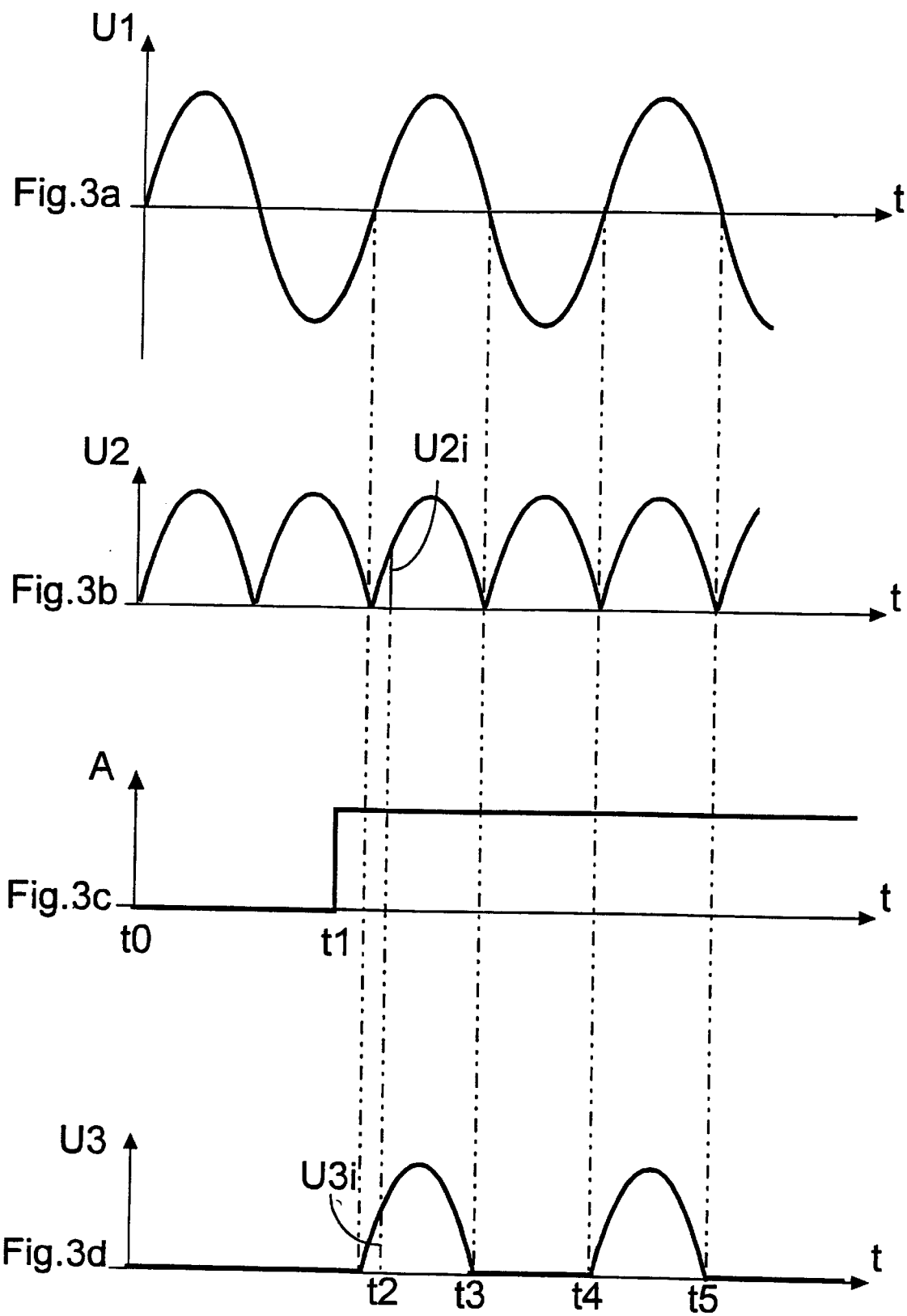
FIGS. 3a to 3d represent, versus time, respectively the wave-forms of the voltages U1 and U2, of a local control order A and of the voltage U3 of the device according to FIG. 1.

The power supply terminals B1 and B2 are permanently connected to a power supply system supplying a supply voltage U1. In the embodiment represented, the voltage U1 is a sinusoidal AC voltage (FIG. 3a). The voltage U1 is rectified by the rectifier 2 and the full-wave rectified voltage is applied to the terminals of the first resistive dividing bridge R1, R2. The voltage U2 at the terminals of the resistor R2 is applied to the first input E1 of the circuit 4. The voltage U2 (FIG. 3b) is therefore representative of the rectified supply voltage. The resistive bridge enables the input voltage U2 to be adapted to values compatible with a digital processing circuit, for example a microprocessor-based circuit.

The voltage U3 at the terminals of the resistor R4 is applied to the input E2 of the circuit 4. Between the times t0 and t1, no local control order is supplied to the device (A=0) and the local control means (5a, 5b) is open. No voltage is then applied to the terminal B3 and the voltage U3 (FIG. 3d) is null.

At the time t1 a local control order (A=1) is supplied, either by closing of the push-button button 5a or by actuation of the programmable controller output 5b. The terminal B3 is then connected to the terminal B2.

The voltage U3 is a half-wave rectified voltage, which is rectified by means of a diode of the rectifier 2 connected between ground and the terminal B2. Thus, as represented in FIGS. 3a to 3d, when at time t1 the voltage U1 is negative, the voltage U3 remains null until the following positive half-wave of the voltage U1 . Then, so long as A=1, the voltage U3 is null during the negative half-waves of U1 (t3–t4) and representative of the value of U1, or of the voltage applied to the terminal B3 during the positive half-waves of U1 (t2–t3, t4–t5).

In a preferred embodiment the two resistive dividing bridges have the same dividing ratio, and preferably R1=R3 and R2=R4. The values taken by the voltages U2 and U3 can thus be compared more easily.

Excitation of the coil 3 must be commanded by the circuit 4 when a control order is applied to the device 1, i.e. when a voltage is applied to the terminal B3. To eliminate spurious control orders due for example to leakage currents generated when the local control means are in the open state, the circuit 4 compares a first quantity G1, representative of the voltage U3, measured during the non-null half-waves (t2–t3, t4–t5) with a second quantity G2, representative of the voltage U2.

Figure 4:
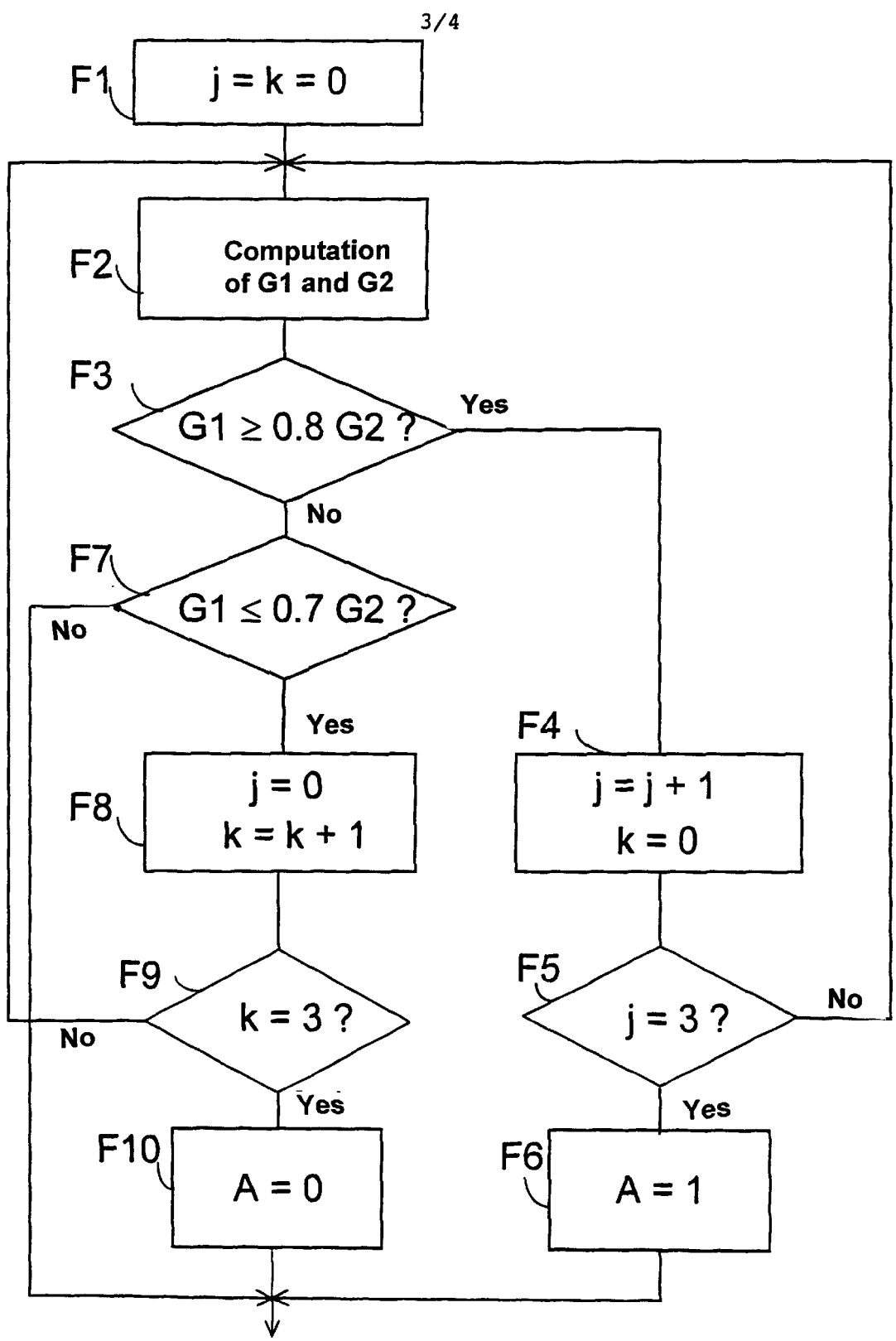
FIG. 4 represent a particular embodiment of a sub-routine for determining the state of the local control of a device according to the invention.

The sub-routine for detecting the state of the local control means of FIG. 4 schematizes a particular embodiment of operation of a microprocessor of the circuit 4. During a first initialization step F1, two indicators j and k are set to 0. Then during a second step F2, the microprocessor computes the associated values of the first and second quantities G1 and G2.

Then, during a step F3, it compares the first quantity G1 with a preset first percentage of the second quantity G2. In FIG. 4, this first percentage is 80%, i.e. G1 is compared with 0.8G2. If the first quantity G1 is greater than or equal to this first percentage (YES output of F3), the indicator j is incremented (j=j+1) in a step F4 and the indicator k is reset to 0. Then, in a step F5, the microprocessor checks if j is equal to 3. If this is not the case (NO output of F5), it loops back onto the input of the step F2. If on the other hand this is the case (YES output of F5), this means that three successive values of G1 are greater than 80% of G2 and the local control means is considered as being active, i.e. closed. In a step F6, a value A representative of the local control order is then set to a logic value corresponding to this state, 1 in FIG. 4. This order will then be interpreted, in known manner, by the microprocessor so as to command excitation of the coil 3.

If during the step F3 the first quantity G1 happens to be less than 0.8G2 (NO output of F3), the microprocessor then goes on to a step F7 in which the first quantity G1 is compared with a second percentage of the second quantity G2, the second percentage being smaller than the first percentage. In FIG. 4, this second percentage is 70%, i.e. G1 is compared with 0.7G2. If the first quantity G1 is smaller than or equal to 0.7G2 (YES output of F7), in a step F8 the indicator k is incremented (k=k+1) and the indicator j is reset to 0. Then, in a step F9, the microprocessor checks if k is equal to 3. If this is not the case (NO output of F9), this means that three successive values of G1 are lower than 70% of G2 and the local control means is considered to be inactive, i.e. open. In a step F10, the value A representative of the local control order is then set to a logic value corresponding to this state, complementary to the previous state, 0 in FIG. 4. This will then be interpreted by the microprocessor as an absence of a local control order and excitation of the coil 3 will not take place.

If on the other hand during the step F7 the first quantity G1 happens to be greater than 0.7G2 (NO output of F7), which means that it is comprised between 0.7G2 and 0.8G2, the microprocessor does not take any decision concerning the state of the local control means, which is then considered not to have changed state with respect to its previous state. The value A of the local control order is then unchanged.

The use of a hysteresis enables detrimental oscillations to be prevented. The preferred values of the percentages, i.e. 70% and 80%, are compatible with programmable controller norms. The use of the indicators j and k leads the microprocessor to only take a decision concerning the state of the local control means when a preset number (for example 3) of successive comparisons leads to the same result.

The first quantity G1 is constituted from at least one non-null sample U3i of the voltage U3. The control circuit 4 proceeds with sampling of the voltage U3 with a preset sampling frequency, fixed in a preferred embodiment. At the same time it also proceeds with sampling of the voltage U2. Two samples U2i and U3i taken simultaneously are associated. FIGS. 3d and 3b each represent respectively a nonnull sample U3i and the associated sample U2i. In practice sampling does not take place simultaneously, but almost simultaneously i.e. quasi-simultaneously. The microprocessor of the circuit 4 in fact proceeds with sampling and analog-to-digital conversion of one of the samples, U3i for example, and then with sampling and analog-to-digital conversion of the associated sample U2i, or vice-versa. As an example the sampling period Te is 0.625 ms and the analog-to-digital conversion time is less than 20 µs (typically about 16 µs), which can be ignored.

Figure 5:
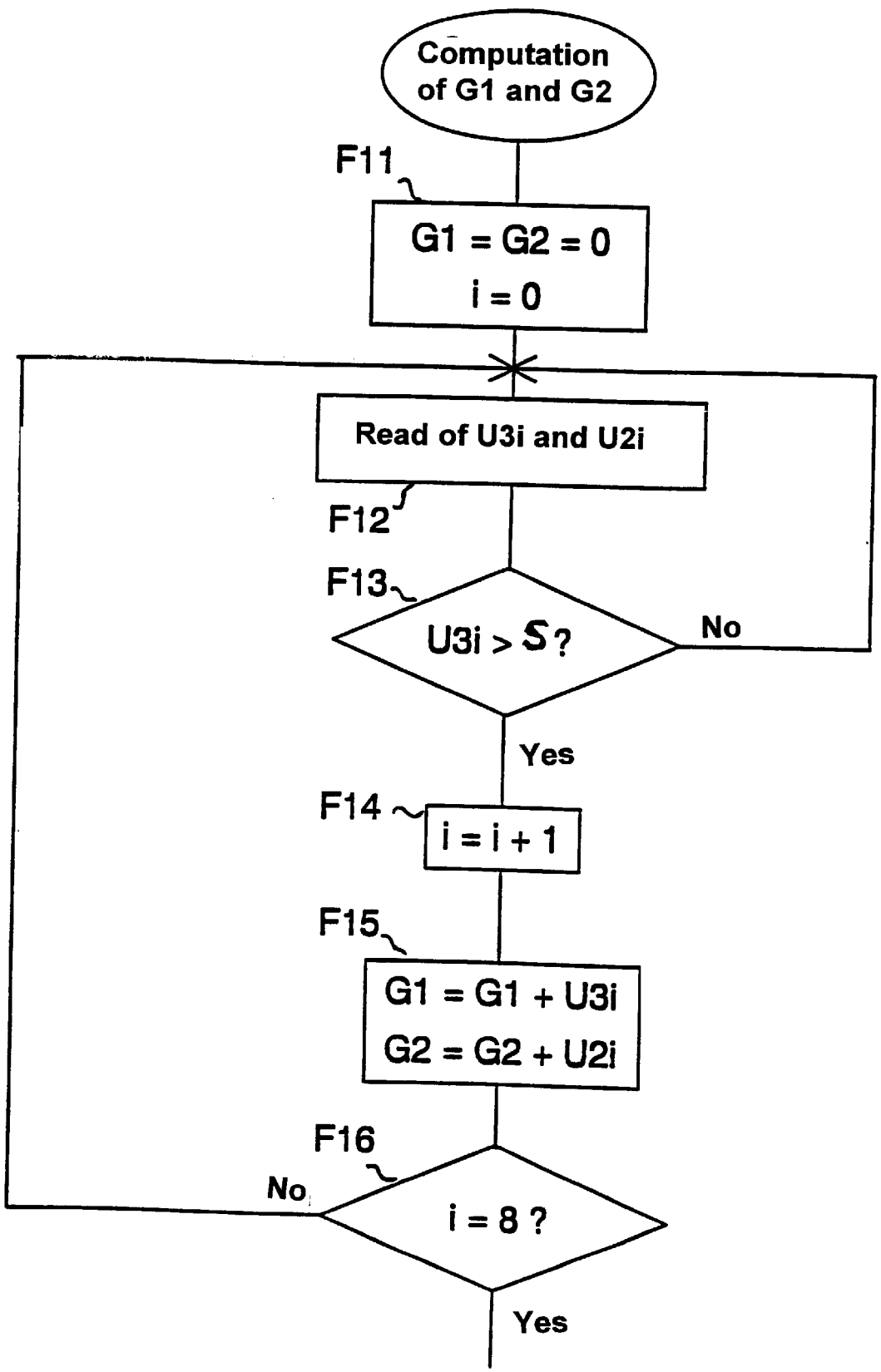
FIG. 5 represents a particular embodiment of a sub-routine for computing the quantities G1 and G2.

FIG. 5 illustrates a preferred embodiment of a sub-routine for computing the quantities G1 and G2. During an initialization step F11 the quantities G1 and G2 and an indicator i are set to zero. Then, during a step F12, the microprocessor performs reading of a sample U3i and of an associated sample U2i, i.e. it samples almost simultaneously and converts these two associated samples. Then, in a step F13, it compares the sample U3i with a preset threshold S, slightly greater than zero. The object of this step is to determine whether sampling took place during a non-null half-wave of the voltage U3, positive in the embodiment represented (t2–t3, t4–t5). As the voltage U3 is in fact only rectified in a single half-wave whereas the voltage U2 is rectified in full-wave, a valid comparison can only be made during the non-null half-waves of the voltage U3. The threshold S is preferably chosen slightly greater than 0, corresponding for example to a few tens of millivolts (50 mV for example) for maximum voltages U2 and U3 of a few volts (5V for example) to eliminate the stray effects due to the noise or to offset phenomena.

If the sample U3i is not greater than the threshold S (NO output of F13), the micro-processor loops back onto the input of F12 until it receives a non-null sample. On the other hand, when U3i is greater than the threshold S (YES output of F13), the indicator i is incremented (i=i+1) during a step F14. This indicator is representative of the number of samples taken into account to compute the quantity G1 or G2. Then during a step F15, the new intermediate values of the quantities G1 and G2 are computed G1=G1+U3i and G2=G2+U2i. Then, in a step F16, the microprocessor checks if the indicator i has reached a preset value, 8 in the figure. If i=8 (YES output of F16) computation of the quantities G1 and G2 is terminated and the computed values are used in the steps F3 and F4 of FIG. 4. If, on the other hand, in F16, i is not yet equal to 8 (NO output of F16), computation of G1 and G2 continues, the microprocessor looping back onto the input of the step F12 to read new samples.

The value of 8 samples for computation of G1 and G2 is a preferred value, but the invention is not limited to this value and applies as soon as a non-null sample of U3 is used.

In the preferred embodiment, the sampling period Te is 0.625 ms and 8 successive non-null samples are used for computing G1, 8 associated samples then being used for computing G2. For a 50 Hz power system, the sampling period used corresponds to 16 samples per half-wave (½ period). 8 samples therefore correspond to a non-null half-wave. In the embodiment represented in FIGS. 3c and 3d, a first value of the first quantity G1 is therefore computed in the middle of the first positive half-wave, following t1, and a second value of the first quantity G1 is computed at the time t3. The voltage U3 between t3 and t4 remaining null, no value of G1 can be computed and a third value of G1 is computed in the middle of the following positive half-wave (t4–t5). Three values of G2 have also been computed and each value of G1 compared with the corresponding value of G2. If the result of the three comparisons is identical, a decision is obtained concerning the state of the local control before the end of the second positive half-wave (t4–t5) of U3 following t1, i.e. appreciably after 25 to 35 ms.

The values of the quantities G1 and G2 thus obtained are, for 50 Hz, representative of the mean value of the corresponding voltages U3 and U2.

If the frequency of the supply voltage U1 is different, the sampling frequency and the number of samples used can remain the same. Satisfactory results are obtained for frequencies ranging from DC to more than 400 Hz. In the case of a DC supply voltage, all the samples obtained after closing of the local control means are not null and the values of G1 and G2 are obtained after 15 ms. In the case of a 400 Hz supply voltage, two samples are measured per half-wave and at least 4 non-null half-waves of U3, i.e. 4 periods of the supply voltage U1, are required to compute a quantity G1. Quasi-simultaneous sampling of the voltages U2 and U3 enables a satisfactory comparison to also be obtained under such conditions.

The invention is not limited to the particular embodiments represented in the figures. In particular the local control means can be connected between the terminals B3 and B2. In this case the non-null half-waves of U3 correspond to the negative half-waves of the supply voltage U1.

The beginning of computation of the quantities G1 and G2 may be synchronized automatically, by any suitable means, on the beginning of a non-null half-wave of U3.

The sampling frequency, the number of samples used for computation of each quantity, and the number of successive comparisons supplying the same result to enable a decision to be made are chosen according to the precision and speed of decision required. As a minimum, a non-null U3i sample is compared with a preset percentage of the associated sample U2i and the result of the comparison is considered as being representative of the state of the local control means.

Processing of the local control input is preferably delayed, for example during 1 s, when the device is powered on, so as to prevent spurious detection of an active state of the local control means in the absence of such a state. This type of spurious detection can in fact occur in the absence of a time delay, essentially due to transient phenomena occurring when the local control terminal is connected to a controller output equipped with a protective capacitor.

What is claimed is:

1. A control device for an electromagnet comprising two power supply terminals, full-wave rectifying means having inputs connected to the power supply terminals, at least one coil connected in series with an electronic switch between outputs of the rectifying means, means for controlling the electronic switch and a local control terminal designed to be connected to one of the power supply terminals by local control means able to take two states, respectively open and closed, the control device comprising a first resistive dividing bridge, connected to the outputs of the rectifying means and comprising a mid-point connected to a first input of the control means of the electronic switch, and a second resistive dividing bridge, connected between the local control terminal and an output of the rectifying means and comprising a mid-point connected to a second input of the control means of the electronic switch, the control means comprising:

quasi-simultaneous sampling means for supplying associated samples of the first and second voltages applied respectively to the first and second inputs of the control means, comparison means for comparison of a first quantity, representative of at least one non-null sample of the second voltage, and of a preset percentage of a second quantity, representative of associated samples of the first voltage, and detection means for detecting the state of the local control means, the local control means being considered closed when the first quantity is greater than said percentage.

2. The device according to claim 1, wherein the comparison means comprise means for comparing the first quantity to first and second percentages of the second quantity, the local control means being considered as being closed by the detection means when the first quantity is greater than or equal to the first percentage and as being open if it is lower than or equal to the second percentage, the second percentage being lower than the first percentage.

3. The device according to claim 2, wherein the local control means are considered by the detection means as not having changed state if the first quantity is comprised between the first and second percentages.

4. The device according to claim 2, wherein the first percentage is about 80% and the second percentage about 70%.

5. The device according to claim 1, wherein the first and second quantities are respectively formed by the sum of a preset number of successive non-null samples of the second voltage and by the sum of the same number of associated samples of the first voltage.

6. The device according to claim 5, wherein the number of samples used for computation of the first and second quantity is equal to or greater than 3.

7. The device according to claim 6, wherein the number of samples is equal to 8.

8. The device according to claim 1, wherein a decision concerning the state of the local control means is taken after a preset number of successive comparisons leading to the same result.

9. The device according to claim 8, wherein the number of comparisons is equal to 3.

* * * * *